United States Patent [19]

Ikeno et al.

[11] 4,183,126

[45] Jan. 15, 1980

[54] PROCESS FOR PREPARING QUARTZ OSCILLATOR

[75] Inventors: Hitoshi Ikeno, Koganei; Mitsuyuki Sugita, Ichikawa; Hirofumi Yanagi, Tokyo, all of Japan

[73] Assignee: Kabushiki Kaisha Seikosha, Japan

[21] Appl. No.: 867,876

[22] Filed: Jan. 9, 1978

Related U.S. Application Data

[62] Division of Ser. No. 721,784, Sep. 9, 1976, abandoned.

[51] Int. Cl.² .......................... B23K 31/02; H04R 1/02
[52] U.S. Cl. .................................. 29/25.35; 228/123; 228/180 A; 228/212; 310/352
[58] Field of Search ............................... 228/122–124, 228/180 R, 180 A, 208, 209, 212, 215; 29/25.35; 310/351, 352

[56] References Cited

U.S. PATENT DOCUMENTS

| 2,859,720 | 11/1958 | Palmer et al. | 228/212 X |
|---|---|---|---|
| 3,072,806 | 1/1963 | Sogn | 310/352 X |
| 3,158,927 | 12/1964 | Saunders | 228/180 X |
| 3,230,297 | 1/1966 | Means | 228/215 X |
| 3,230,609 | 1/1966 | Kooi et al. | 228/123 X |

Primary Examiner—Francis S. Husar
Assistant Examiner—Kenneth J. Ramsey
Attorney, Agent, or Firm—Robert E. Burns; Emmanuel J. Lobato; Bruce L. Adams

[57] ABSTRACT

A quartz oscillator comprises a quartz blank having electrode films deposited on opposite parallel faces thereof. Holding wires which are parallel to the quartz blank extend along and spaced slightly from the opposite faces of the blank and are locally soldered to the quartz blank. The holding wires extend beyond the edge of the quartz blank and are secured to a holding substrate provided with electrical connections. The quartz oscillator is prepared by positioning a quartz blank and a holding substrate in a supporting frame, opposite faces of the quartz blank and holding substrate being provided at selected positions with solder parts. The holding wires are then positioned along opposite faces of the quartz blank and holding substrate and the solder parts are temporarily fused by radiant heat to bond the holding wires to the quartz blank and the holding substrate.

15 Claims, 9 Drawing Figures

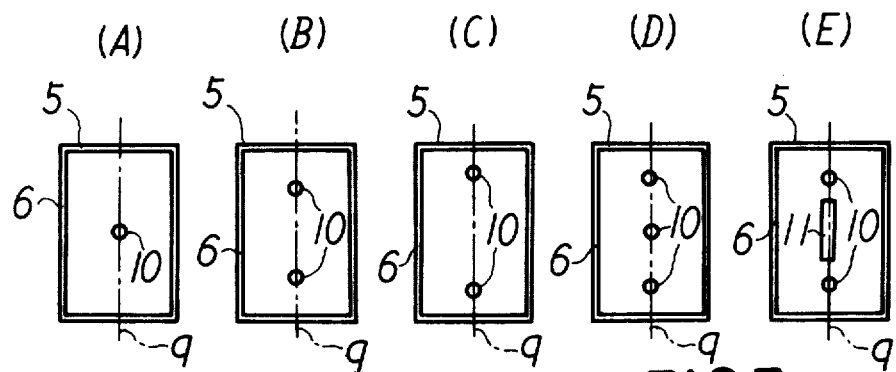
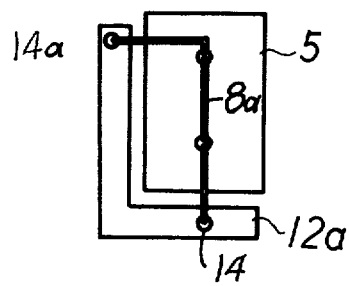
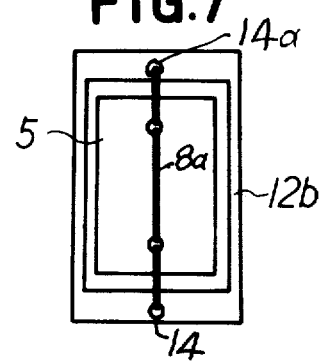
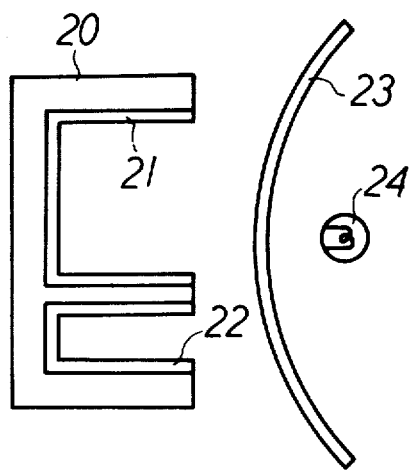
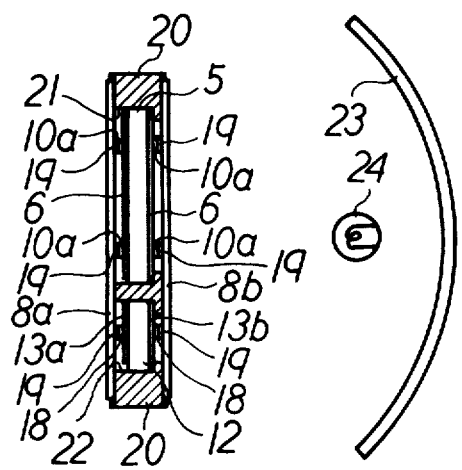

PROCESS FOR PREPARING QUARTZ OSCILLATOR

This is a divisional of application Ser. No. 721,784 filed Sept. 9, 1976, now abandoned.

FIELD OF INVENTION

The present invention relates to quartz oscillators and to a method for preparing such oscillators.

BACKGROUND OF INVENTION

A prior art system for holding a quartz oscillator is the wire support type in which headed holding wires are secured to a quartz blank perpendicular to the plane of the blank. The other ends of the holding wires are secured to support posts which project up from a base on opposite sides of the quartz blank. Solder balls are positioned on the holding wires to adjust the effective length of the holding wires to the frequency of the oscillator. The positional adjustment of the solder balls must be performed for all of the holding wires. This is a very delicate, difficult and time-consuming operation. Moreover, if the effective length of the holding wire is made small, the heating of the solder balls to adjust their position may result in melting the solder which joins the holding wire to the quartz blank.

In the case of a GT cut quartz oscillator, adjustment of the frequency and temperature characteristic of the oscillator can be effected by polishing the longer and shorter side edges of the quartz blank. Usually these adjustments need to be carried out in the finally assembled state of the oscillator with the oscillator electrically connected so that the frequency and the temperature coefficient can be measured. With the prior art wire support type oscillator it requires great skill and care to polish the side surfaces without bending the holding wires. It is therefore common practice to detach the holding wires from the supporting posts each time to perform the polishing. This involves many inconveniences and is a time-consuming operation.

A further disadvantage of the prior art construction is that since the holding wires are normal to the plane of the quartz blank, a considerable amount of space is unavoidably occupied by the assembly comprised in the quartz blank, holding wires and supporting posts. This limits the miniaturization of the oscillator in the thickness direction of the quartz blank.

SUMMARY OF INVENTION

It is an object of the present invention to eliminate the disadvantages and inconveniences of the prior art and to provide a quartz oscillator which is easy to manufacture and to adjust for proper frequency and temperature characteristic and which lends itself to miniaturization.

In accordance with the present invention, the holding wires are positioned parallel to the quartz blank and extend along and are slightly spaced from opposite faces of the blank. The holding wires are locally soldered to opposite faces of the quartz blank and extending portions of the holding wire are coupled with a holding substrate provided with suitable electrical connections. In accordance with the method of the present invention a quartz blank and a holding substrate are provided at selected locations on opposite faces with solder parts and are positioned in a frame which supports the quartz blank and the holding substrate in selected position relative to one another. Holding wires are then positioned at opposite sides of the quartz blank and substrate in contact with the solder parts and heat is then applied to fuse the solder momentarily and thereby bond the holding wires to the quartz blank and the holding substrate.

A BRIEF DESCRIPTION OF DRAWINGS

The nature, objects and advantages of the invention will be more fully understood from the following description in conjunction with the accompanying drawings in which:

FIG. 5 is a schematic view showing five examples of location of solder points provided on the quartz blank.

FIGS. 6 and 7 are front views showing further examples of holding substrates.

FIG. 8 is a front view of a supporting frame for use in preparing a quartz oscillator in accordance with the method of this invention; and FIG. 9 is a schematic view partially in section showing an example of solder fusing means for coupling the holding wires to the quartz blank and holding substrate.

DESCRIPTION OF PRIOR ART OSCILLATOR

Figure 1:
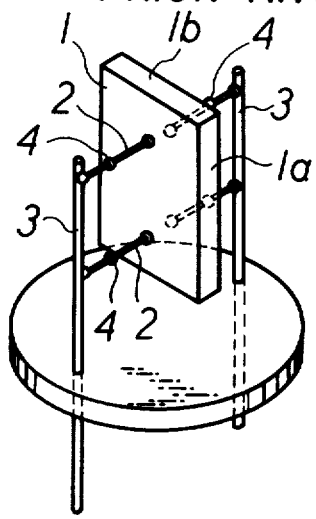
FIG. 1 is a perspective view of a prior art oscillator in which a GT cut quartz blank is supported by a wire type support.
Figure 2:
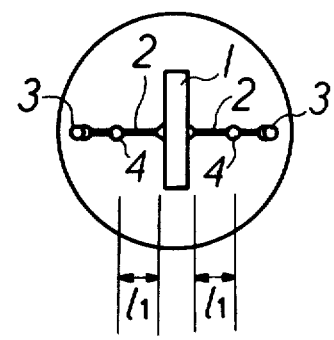
FIG. 2 is a plan view of the oscillator shown in FIG. 1.

A prior-art quartz oscillator in which the quartz blank is supported by a wire type support is illustrated in FIGS. 1 and 2. A quartz blank 1 is supported by headed holding wires 2 which are disposed perpendicular to the plane of the quartz blank. One end of each of the holding wires is soldered to the quartz blank while the other end is coupled to a supporting post 3. A solder ball 4 is provided on each of the holding wires 2 in order to adjust the effective length $l_1$ of the holding wire according to the frequency of the oscillator. The positional adjustment of the solder ball 4 must be performed for each of the four holding wires 2. This is a very delicate and difficult operation.

Further, if the effective length $l_1$ of the holding wires 2 is made small there is danger that in the adjustment of the solder balls 4 the solder connections between the holding wires 2 and the oscillator blank will also be fused. This limits miniaturization of the oscillator in the direction of the thickness of the quartz blank.

In the case of a GT cut quartz oscillator, the frequency of oscillation and the temperature coefficient can be independently adjusted by polishing selected side surfaces of the quartz blank. Usually the adjustments need to be carried out in the finally assembled state of the oscillator so that the frequency and the temperature coefficient can be measured. Thus, while making measurements a side surface 1a in the shorter side direction and a side surface 1b in the longer side direction must be polished in the state that the quartz oscillator is electrically connected as shown in FIG. 1. It requires skill and a great deal of care to polish the side surfaces 1a and 1b without bending the holding wires 2. It is therefore common practice to detach the holding wires 2 from the supporting posts 3 each time that the polishing operation is performed. This involves many inconveniences and increases the price of production of the oscillators.

DESCRIPTION OF PREFERRED EMBODIMENTS

Figure 3:
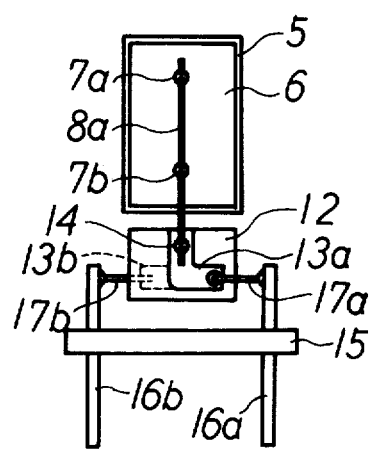
FIG. 3 is a front view of an oscillator in accordance with the invention.
Figure 4:
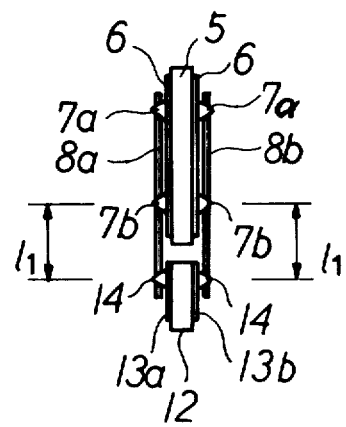
FIG. 4 is a partial right side view of the oscillator shown in FIG. 3.

A quartz oscillator in accordance with the present invention is shown by way of example in FIGS. 3 and 4. A quartz blank 5 is formed on both of its opposite faces with electrode films 6 by vacumn evaporation. Silver dots are baked on the quartz blank 5 at selected holding positions.

Holding wires 8a and 8b which are parallel with the plane of the quartz blank 5 extend along and slightly spaced from opposite faces of the blank and are secured to the quartz blank by solder cones 7a and 7b formed on the silver dots. Different positions at which the silver dots may be located are illustrated in FIG. 5 by examples A-E. In example A, there is a single central silver dot 10 on each face of the quartz blank. In examples B and C there two silver dots 10 on each face of the quartz blank. In example D there are 3 silver dots while in example E there are two silver dots 10 and an intervening silver line 11. In the case of a GT cut quartz oscillator, examples B-E of FIG. 5 are effective for achieving such purposes as preventing diminution of the shorter side vibration, securing sufficient mechanical strength for holding the quartz blank, suppressing the longer side vibration and suppressing the thickness bending vibration which is an unnecessary oscillation mode. Silver points 10 or silver points 10 and a silver line 11 are provided on a nodal line 9 of the shorter side vibration of the quartz plate 5. The silver line 11 serves to suppress the thickness bending vibration and can also be provided in examples A-D.

The solder cones 7a, 7b are formed on the silver points 10 or silver line 11 for bonding holding wires 8a and 8b to the quartz blank. Straight wires are used for the holding wires 8a and 8b. Besides phosphor bronze which is usually employed for the headed wires of the conventional construction shown in FIG. 1 there can be employed materials having a constant modulus of elasticity and exhibiting a low modulus of thermal expansion for example, elinvar alloys and co-elinvar alloys. It is convenient for the holding wires to be subjected to gold plating or the like in advance so as to enhance the affinity with the solder.

The holding wires 8a and 8b extend beyond the edge of the quartz blank and are coupled with a holding substrate 12. The holding substrate 12 comprises a plate of ceramics, glass-epoxy or the like on opposite faces which there are provided L-shaped connectors 13a and 13b. Suitable selection of the thickness of the substrate 12 facilitates keeping appropriate intervals between the surfaces of the quartz blank 5 and holding wires 8a and 8b. The extended lower ends of the holding wires 8a and 8b are coupled by supporting solder parts 14 to upper end portions of the L-shaped conductors 13a 13b provided on opposite faces of the holding substrate 12. The adjustment of the length of the holding wires is effected by adjusting the interval $l_1$ between the solder cones 7b and the supporting solder part 14. Since the holding interval between the holding wires 8a and 8b can be made sufficiently large without increasing the size of the oscillator assembly in the thickness direction of the quartz blank 5 there is no danger of the solder cones 7b being fused when adjusting the length $l_1$ by fusing the supporting solder 14.

In the case of a GT cut quartz oscillator the adjustments of the proper frequency and the temperature characteristic are carried out in the state illustrated in FIG. 4. Since no abnormal force tending to bend the holding wires 8a and 8b is exerted in polishing the side surfaces in the longer and shorter side directions, the adjustment is easily effected without fear of damaging the holding means of the oscillator.

As illustrated in FIG. 3 the oscillator is mounted on terminals 16a and 16b which penetrate a base 15. The upper ends of the terminal 16a, 16b are coupled to the lower end portions of the conductors 13a, 13b on opposite faces of the substrate 12 by lead wires 17a, 17b such as phosphor bronze wires or piano wires. As the length $l_1$ of the holding wires 8a, 8b and the lead wires 17a, 17b absorb external shocks the oscillator has good shock resistance. If desired however, the shape of the lead wires 17a, 17b can be designed to absorb external shocks still more effectively. The shape of the substrate 12 is not restricted to the example shown in FIG. 3. There may be employed for example an L-shaped substrate 12a as shown in FIG. 6 or a hollow rectangular substrate 12b as shown in FIG. 7. It will be seen that in FIG. 6 the holding wires are bent at right angles and both ends of holding wires are coupled with the substrate 12a by solder parts 14 and 14a. In FIG. 7 opposite ends of the straight holding wires are soldered to opposite end portions of the hollow substrate 12b by solder portions 14 and 14a respectively. In the case illustrated in FIG. 7 the quartz blank 5 must be detached from the frame 12b in order to effect adjustment of the frequency and temperature coefficient of the oscillator.

A method for preparing a quartz oscillator in accordance with the present invention will now be described. First of all the electrode films 6 are formed on both surfaces of the quartz oscillator blank 5 for example by vacumn evaporation and the silver dots 10 or dots 10 and line 11 as illustrated in FIG. 5 are baked on. The substrate 12 is formed with the lead conductors 13a and 13b provided on opposite faces. Subsequently solder discs 19 (shown in FIG. 9) are made by rolling the solder to a selected thickness and punching discs of a predetermined diameter from the sheet and such discs are stuck by a paste or adhesive to silver dots 10a at the holding positions among the silver dots 10 and also at predetermined positions on the lead conductors 13a and 13b.

The parts of the oscillator are then assembled by means of a supporting frame 20 as shown in FIG. 8 for supporting the quartz blank 5 the holding wires 8a, 8b and the holding substrate 12 at predetermined intervals. As seen in FIG. 8 the supporting frame 20 is E-shaped and is formed with steps or grooves 21 and 22 for respectively supporting the quartz plate 5 and the holding substrate 12 in predetermined spatial relation to one another. As illustrated in FIG. 9 the quartz plate 5 and the holding substrate 12 are respectively inserted in the steps 21 and 22 and the straight holding wires 8a and 8b are placed at predetermined positions on the supporting frame 20. At this time the coupling is facilitated by previously sticking the holding wires 8a and 8b to the soldered discs 19 by the use of a paste.

Infrared ray lamps 24 are arranged inside confronting reflectors 23 and the supporting frame 20 is situated therebetween. By the irradiation by the infrared rays the soldered discs 19 are temporarily moltened so as to couple the holding wires 8a and 8b to the quartz blank 5 and to the holding substrate 12. Thereafter, the supporting frame 20 is pulled away leaving the assembled oscillator in the state shown in FIG. 4.

When the holding the wires 8a and 8b are previously subjected to aluminum plating or like treatment at parts other than the positions to be soldered the solder can be prevented from spreading.

It is also possible to arrange the infrared ray lamp and reflector 20 on only one side so as to couple one of the holding wires and thereafter to reverse the frame 20 and couple the other holding wire.

It is convenient for the supporting frame 20 to be provided with shallow grooves for locating the holding wires 8a and 8b.

The side surface in the shorter side direction and that in the longer side direction of the quartz blank 5 are polished with the oscillator in the state shown in FIG. 4 to perform the adjustments of a proper frequency and temperature characteristic of the oscillator. The lead wires 17a and 17b are secured to the conductors 13a and 13b of the substrate 12 and are coupled to the terminals 16a and 16b respectively extending through the base 15. The resultant structure is then sealed by a metallic cap. Thus the fabrication of the oscillator is completed.

With the construction in accordance with the present invention the overall size of the oscillator in the thickness direction of the quartz blank can be made very small so that miniaturization can be accomplished. Since the holding wires are coupled in parallel with the plane of the oscillator ordinary wires can be employed instead of headed wires. There is no fear of working distortion and the material of the wires can be selected from a wide range so that low cost is insured and the length adjustment of the holding wires is easy. The holding wires are coupled in the manner of being enveloped in the solder so that satisfactory strength is attained even when fine wire is used.

In the state in which the quartz blank, the holding wires and the holding substrate are coupled with one another but the substrate is detached from the terminals of the base the adjustments of the proper frequency and the temperature characteristic can easily be made. By coupling the GT cut quartz oscillator to the holding wires at a plurality of points along the nodal line the thickness bending vibration—which is an unnecessary oscillation mode—can be supressed and simultaneously therewith, the longer side vibration can be reduced. Furthermore, by coupling the holding wires with the quartz blank and the holding while the blank and substrate are supported by the supporting frame the relative positional accuracy of the quart blank, the holding wires and the holding substrate can be maintained and the soldering of all the coupling points can be affected in one step so that fabrication of the oscillator is facilitated.

While preferred embodiments of the invention have been illustrated in the drawings and are herein particularly described it will be recognized by those skilled in the art that many alterations and modifications may be made and that the invention is in no way limited to the illustrated embodiments.

We claim:

1. A method of making a quartz oscillator which comprises preparing a supporting frame which has means for supporting a quartz blank and a holding substrate in predetermined spatial relation to one another, said supporting frame being E-shaped and provided with grooves to receive said quartz blank and holding substrate, preparing a quartz blank and a holding substrate with solder parts at selected holding positions, supporting said quartz blank and said holding substrate by said frame, positioning holding wires on said solder parts provided on said quartz crystal and said holding substrate and applying heat to said solder temporarily to fuse it and thereby couple said holding wires with said quartz blank and said holding substrate.

2. In a method of making a quartz oscillator, the combination of steps of:

preparing a quartz blank with parallel opposite faces and with conductive electrode films on both of said faces, preparing a substrate of insulating material with lead connections plated on opposite faces of said substrate, the thickness of said substrate being approximately equal to the thickness of said quartz blank, applying solder parts to said lead connectors of said substrate and at selected positions on both of said opposite faces of said quartz blank, providing a supporting frame for supporting said quartz blank and said substrate, positioning said quartz blank and said substrate on said frame with opposite faces of said quartz blank at least approximately co-planar with opposite faces of said substrate and with said quartz blank and substrate spaced from one another in an edgewise direction, positioning holding wires parallel to and spaced slightly from opposite faces of said quartz blank and said substrate and in engagement with said solder parts on said quartz blank and substrate, and applying heat to said solder parts to fuse them temporarily and thereby couple said holding wires with said quartz blank and said substrate.

3. A method according to claim 2, in which small silver areas are applied to said electrode films on opposite faces of said quartz blank at locations where said solder parts are to be applied and in which said solder parts comprising small solder discs are pasted to said silver areas before said holding wires are positioned.

4. A method according to claim 3, in which said holding wires are pasted to said solder discs before said heat is applied to fuse said solder discs to couple said holding wires with said quartz blank and said substrate.

5. A method according to claim 2, in which said supporting frame is E-shaped with three arms and a connecting portion, first and second arms being spaced to receive said quartz blank between them and second and third arms being spaced to receive said substrate between them.

6. A method according to claim 5, in which said supporting frame is sufficiently thicker than said quartz blank and substrate that holding wires positioned on opposite faces of said frame are spaced from opposite faces of said quartz blank and substrate.

7. A method according to claim 6, in which opposite faces of said supporting frame are provided with shallow grooves to receive and position said holding wires.

8. A method according to claim 2, in which said heat is first applied to one face of said quartz blank and substrate to couple a said holding wire with said face and thereafter said heat is applied to the opposite face of said quartz blank and substrate to couple a second holding wire with said opposite face.

9. A method according to claim 2, in which said holding wires are gold plated only at those locations where said holding wires engage said solder parts.

10. A method according to claim 2, in which said holding wires are coated with a solder-resist coating except at those locations where said holding wires engage said solder parts.

11. A method according to claim 2, in which said heat is applied as radiant heat.

12. A method according to claim 2, further comprising the step of polishing at least one edge of said quartz blank to adjust the frequency and temperature coefficient after said quartz blank and substrate are assembled by said coupling of said holding wires with said quartz blank and substrate and without disassembly thereof.

13. A method according to claim 2, in which said quartz blank is rectangular, and in which said substrate is prepared in L-shaped form and positioned with one portion extending along and spaced from one edge of said quartz blank and another portion extending along and spaced from an adjoining edge of said quartz blank.

14. A method according to claim 2, in which said quartz blank is rectangular, and in which said substrate is prepared in the shape of a hollow rectangle and positioned to frame said quartz blank with spaces between the edges of said quartz blank and said substrate.

15. A method according to claim 2, further comprising the steps of providing an insulating base with spaced parallel terminal conductors extending through said base, positioning said substrate between inner end portions of said terminal conductors and soldering lead wires to said terminal conductors and to said lead connectors on opposite faces of said substrate to mount said substrate and said quartz blank coupled therewith.

* * * * *